United States Patent [19]

Wilson et al.

[11] 4,097,769

[45] Jun. 27, 1978

[54] CIRCUIT FOR CONTROLLABLY PROVIDING POWER FROM AN AC SOURCE TO A LOAD

[75] Inventors: Michael A. Wilson, Sarasota; Fred J. Momparler, Bradenton; Kenneth Coleman, Sarasota, all of Fla.

[73] Assignee: Electro Corporation, Sarasota, Fla.

[21] Appl. No.: 739,261

[22] Filed: Nov. 5, 1976

[51] Int. Cl.² .......................................... H03K 17/56
[52] U.S. Cl. ................................. 307/252 B; 307/308; 328/5
[58] Field of Search ................. 328/5; 307/252 B, 308

[56] References Cited

U.S. PATENT DOCUMENTS

| | | | |
|---|---|---|---|
| 3,524,997 | 8/1970 | Harnden et al. | 307/252 B |
| 3,527,962 | 9/1970 | Oushinsky et al. | 307/252 B |
| 3,723,769 | 3/1973 | Collins | 307/252 B |
| 3,743,860 | 7/1973 | Rossell | 307/252 B |
| 3,932,770 | 1/1976 | Fantozzi | 307/252 B |

Primary Examiner—John S. Heyman
Attorney, Agent, or Firm—Wegner, Stellman, McCord, Wiles & Wood

[57] ABSTRACT

A transformerless triac control circuit provides direct on/off control of loads including loads requiring a high current. An on/off decision is made twice each period of the source voltage, and the on/off decision results from the happening or the nonhappening of an event such as the detection of a conductive body.

8 Claims, 8 Drawing Figures

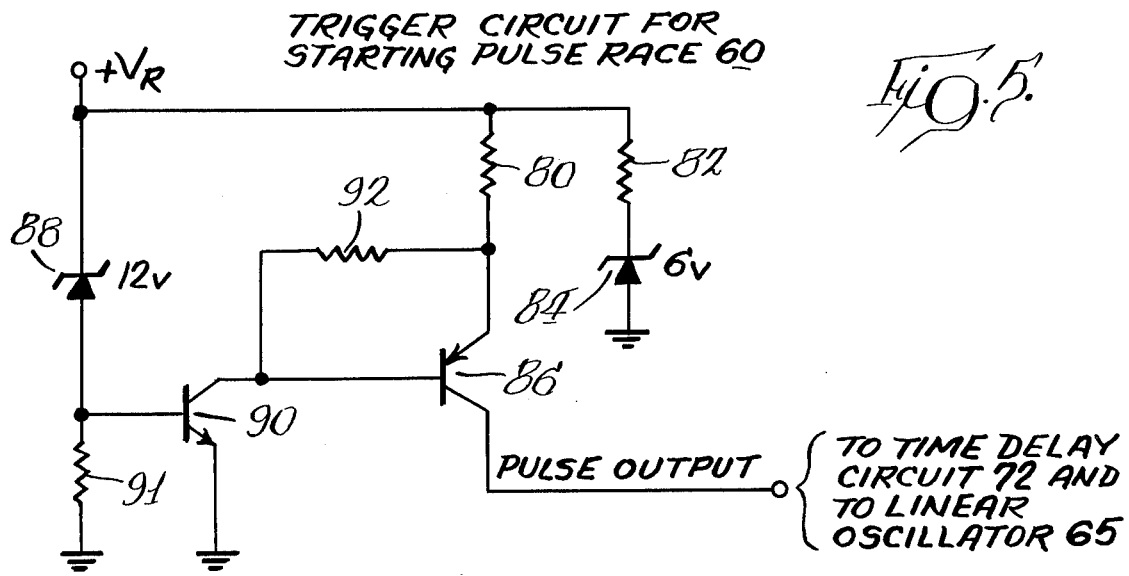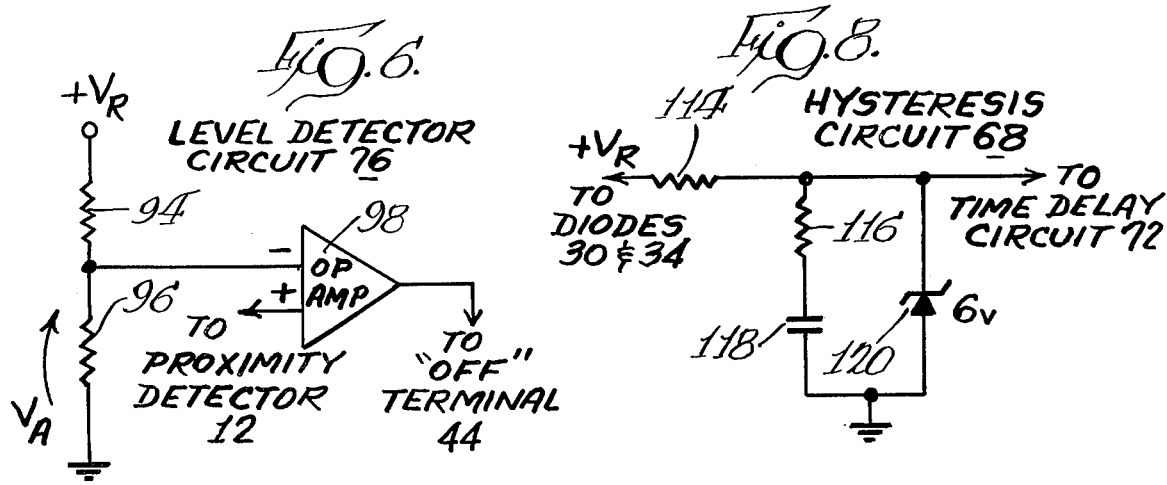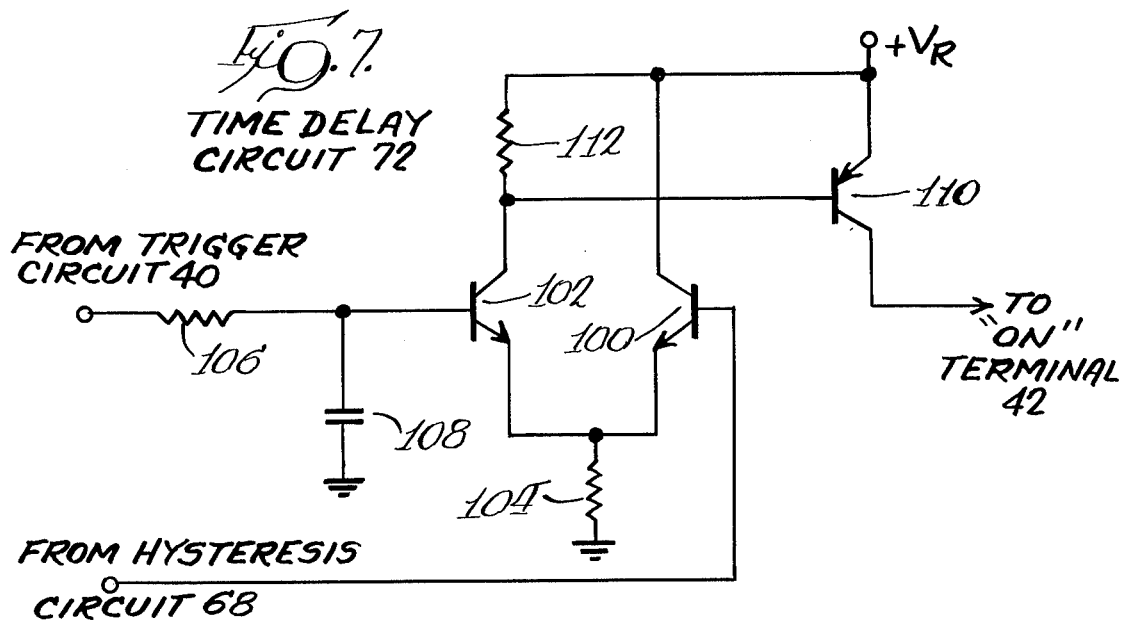

CIRCUIT FOR CONTROLLABLY PROVIDING POWER FROM AN AC SOURCE TO A LOAD

BACKGROUND OF THE INVENTION

This invention relates to switches capable of controlling the application of AC power to a load and, more particularly, to a transformerless triac control switch that controllably energizes or deenergizes the load upon the happening or the nonhappening of an event such as the detection of a conductive body.

Industrial applications often require that a load, such as a solenoid, be energized or deenergized upon the sensing of a conductive body. Accordingly, various devices have been developed to sense the conductive body, then to provide a signal to a load control device which provides or removes power to or from the load.

Such systems require adjustment and calibration, constant maintenance and the current which can be drawn through the circuit is often limited. Often the reliability of such systems has not been acceptable.

I have developed a versatile, solid state limit switch which responds to the detection of a conductive body by controllably opening or closing a transformerless triac circuit. The proximity range of the detection can be adjusted and circuit operation is reliable. When the triac circuit is off, the circuit draws only approximately 2 ma compared to 10-15 ma drawn by prior art circuits. Also, the circuit disclosed herein is capable of controlling a load which draws a current of 8 amps compared to prior art circuits which were limited to controlling loads drawing approximately 200 ma.

SUMMARY OF THE INVENTION

An AC source coupled to a load can be controllably energized by the use of a transformerless triac control switch. The transformerless triac control switch is connected in series with the AC source and the load to provide energization or to remove energization from a load upon the happening of a particular event. The transformerless triac circuit is coupled to a solid state limit switch which detects the presence of a conductive body within the proximity of a sensing probe. The detection of the conducting body, as sensed by the probe, changes the state of the solid state limit switch which in turn either renders the transformerless triac control switch on or off, depending upon the circuit configuration, to either energize or deenergize the load, respectively. The transformerless triac circuit includes a triac, a diode bridge and a transistor to effectively short circuit the gate of the triac to a positive potential to effect its turn-on.

A decision regarding turn-on of the load is made for every half period of the AC source. The solid state limit switch includes a pulse race circuit which determines its on or off condition. The pulse race circuit begins by a trigger pulse every half cycle of the AC source and two pulse paths are provided. One pulse path is provided through a time delay circuit whereas the other pulse path ultimately is provided through the sensing probe which in turn is coupled to a level detector. In the event that there is no conducting body within the range of the sensing probe, the pulse path through the probe and level detector win the race and effectively control the solid state limit switch, whereas in the event that a conducting body does appear within the approximate range of the probe, the pulse on the pulse race path through the time delay circuit wins, and accordingly controls the condition of the triac.

A hysteresis circuit is provided to control circuit operation when an article is in a transition zone between being sensed and not being sensed.

BRIEF DESCRIPTION OF THE DRAWINGS

FIG. 5 is a circuit schematic of the trigger circuit for providing the pulses at the start of the pulse race;

FIG. 6 is a schematic diagram of a typical level detector circuit used in the pulse race circuit;

FIG. 7 is a schematic diagram of the time delay circuit used in the pulse race circuit; and FIG. 8 is a schematic diagram of the hysteresis circuit also used in the pulse race circuit.

DESCRIPTION

Figure 1:
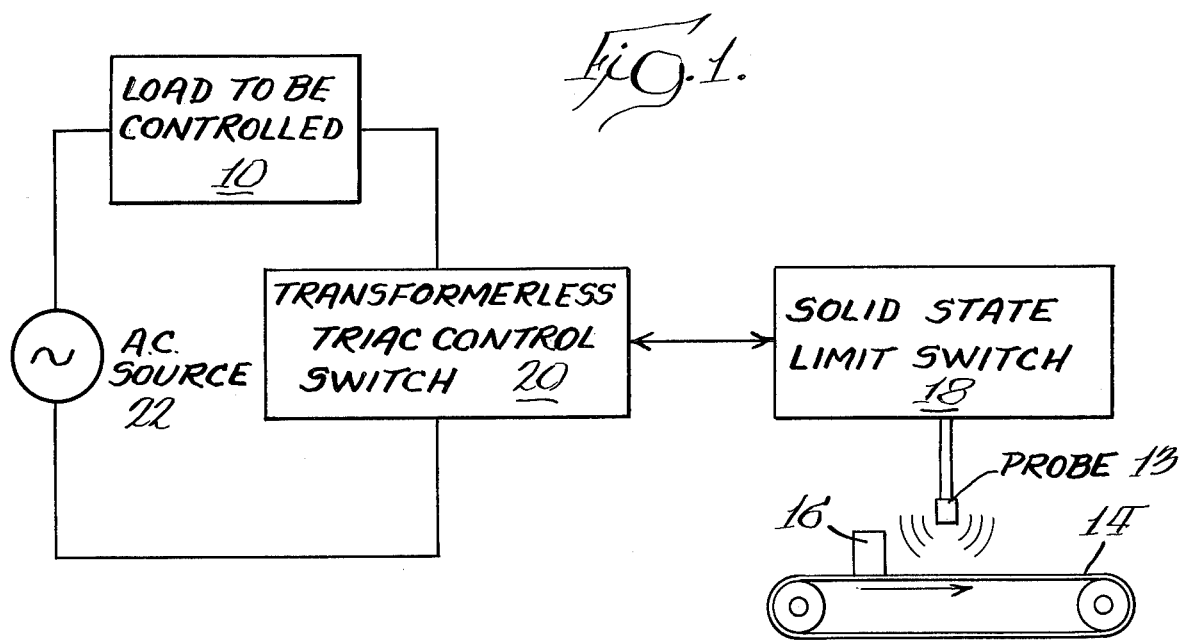
FIG. 1 is a block diagram of the circuit capable of controlling a load in response to the proximity of a conductive body.

Referring to FIG. 1, it is desired that power from the AC source 22 be controllably provided to load 10. The load may be entirely resistive or may have an inductive or capacitive component. Load 10 is usually a motor or a solenoid which is to be either energized or deenergized depending upon the happening or nonhappening of an event. Specifically, detecting probe 13 of solid state limit switch 18 is positioned in an area where the anticipated event is to occur such as, for example, above a conveyor belt 14 carrying cans or other articles 16. When the article, such as can 16, moves within the sensing distance of the probe 13, it is detected and a signal is provided to the solid state limit switch 18 regarding the presence of can 16. The solid state limit switch 18 renders transformerless triac control switch 20 either open or closed, depending upon the desired function, so as to disconnect or connect load 10 respectively from or to source 22. The solid state limit switch provides a signal to the triac start switch indicating whether it is to change states two times during each period of the voltage waveform from source 22. If source 22 is 60 Hz, the system is capable of changing the state of the transformerless triac control switch 20 once every 8 milliseconds. The higher the frequency of the AC source, the more rapidly the solid state limit switch is capable of controlling transformerless triac control switch 20.

Assume that load 10 is a solenoid that requires a 110 V, 60 Hz signal for energization and that the solenoid is to be energized as can 16 traverses the sensing probe 13, at which time an arm (not shown) controlled by the solenoid pushes the can off the conveyor 14 into a bin (not shown). In this situation, triac control switch 20 is normally open and solid state limit switch 18 makes a decision every 8 milliseconds (twice each period) that it is to remain open. A conveyor 14 moves in the direction shown, the can comes within the range and is detected by sensing probe 13. Accordingly, probe 13 provides a signal to the solid state limit switch 18 indicating the presence of the can. Since the solid state limit switch makes a decision twice each period of the source frequency, at the next opportunity to do so it signals transtransistor 48 remains clamped at its previous level which, for purposes of the present discussion, may be assumed to be V/4. At time $t_2$, the potential A at the emitter electrode has risen to a value equal to one base emitter junction drop ($1V_{BE}$) above the base electrode potential and transistor 48 turns on. The emitter voltage is now clamped to a level $1V_{BE}$ above the base voltage so that during the period $t_2$ to $t_3$ the voltage A remains constant.

The emitter-to-collector current of transistor 48 now flows through the capacitor 64 and diode-resistor network 66, 68, to the gate-to-cathode circuit of SCR 30, triggering the SCR into its on condition. The voltage C at the collector 62 rises quickly when transistor 48 turns on (time $t_2$), allowing capacitor 64 to pass a differentiated pulse. The jump in voltage C (shown as $V_{GK}$ in FIGURE 2) results from a corresponding jump in voltage D at the gate electrode of the SCR plus the jump across diode 66 (if used). The amplitude is such that the SCR conduction threshold $V_T$ is exceeded and the SCR turns on. Once the SCR turns on, the voltage D is clamped (during the period $t_2$-$t_3$) to the gate-to-cathode junction voltage level, which explains the flat portion of D during $t_2$-$t_3$. During $t_2$-$t_3$, the collector current of transistor 48, which current passes through capacitor 64, charges the same, and thus is manifested as an increase in the voltage C.

At time $t_3$ the voltage C has risen enough to cause transistor 48 to operate at saturation. The voltage C now can rise only if the voltages at A and B rise. With transistor 48 in saturation, heavy base current flows through transistor 48 and from it through capacitor 78 (and resistor 56 in parallel therewith) and into the base 83 of transistor 72. This turns on transistor 72 which also operates in saturation and the voltage D at the gate electrode 70 drops to a value $V_{CE(SAT)}$ above ground. This drop in gate voltage does not turn off the SCR because its anode is still at a positive potential. But it places the gate 70 at a level such that the SCR can be "commutated" (turned off) by the reversal of the voltage at its anode.

During the period $t_3$ to $t_4$, the voltages A, B, and C rise together and capacitors 44, 78 and 64 charge toward the supply level +V. Transistor 48 is operating in saturation. Transistor 72 operates in saturation and provides noise immunity.

Figure 2:
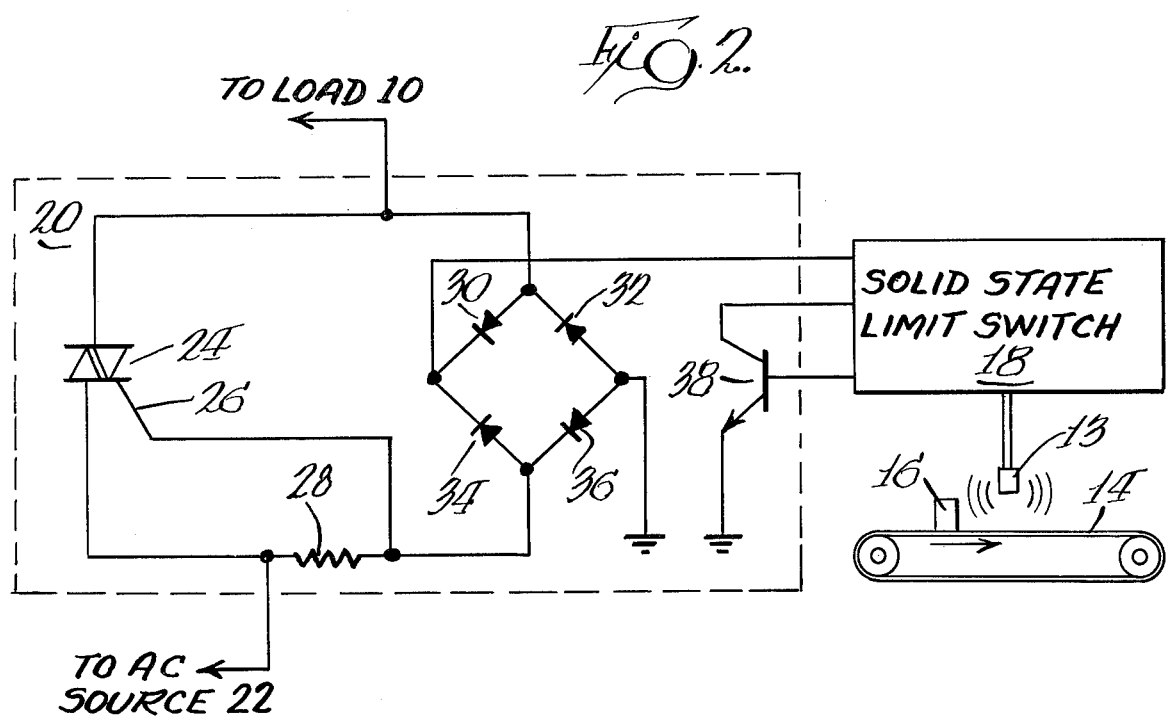
FIG. 2 depicts the transformerless triac control switch used in the system.
Figure 3:
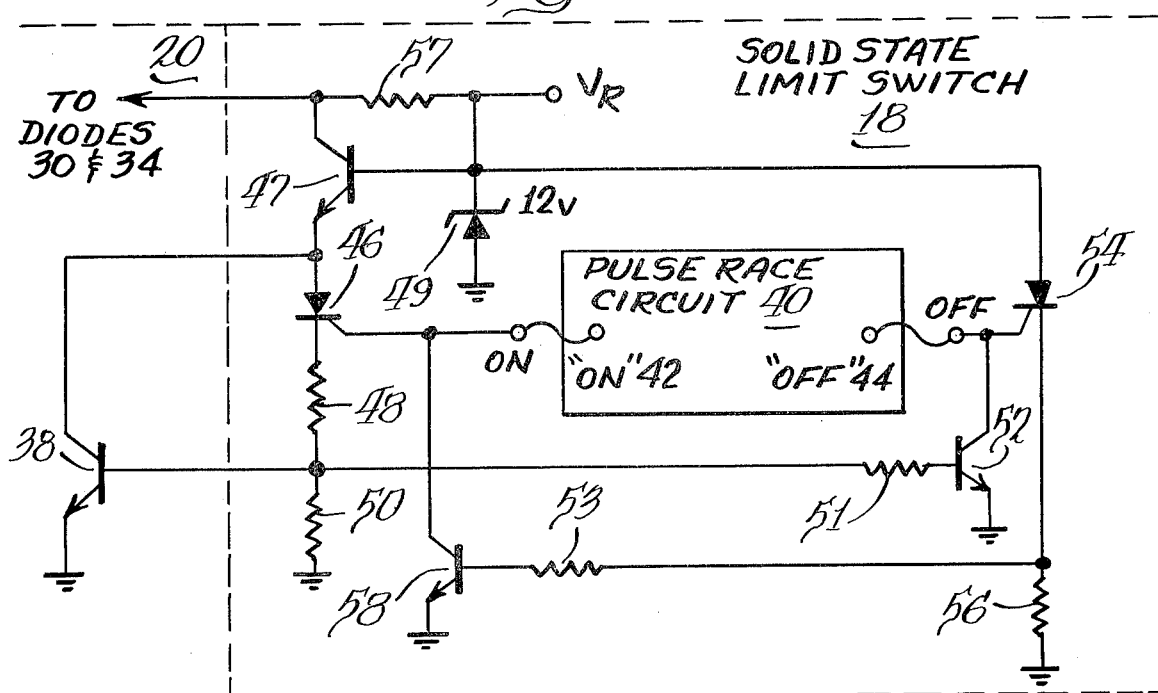
FIG. 3 is a circuit schematic of the solid state limit switch.

FIG. 3 illustrates what occurs in the circuit 26, 32, 30 from the time $t_2$ to the time the SCR turns off (the scale is somewhat expanded relative to FIG. 2). At time $t_2$, the capacitor 26 starts to discharge via primary winding 32 and into the anode-to-cathode circuit of the SCR. The spark fires almost immediately thereafter. The current $I_{32}$ passing through the primary winding 32 increases with time and reaches its greatest positive level at time $t_{2a}$ when the rate of change of voltage across the capacitor 26 is greatest. The current through the primary winding 32 now starts to decrease, going through zero at the negative peak of the voltage across the capacitor 26. This occurs at time $t_{3a}$. Now the negative portion of the ringing cycle starts and diode 90 starts to conduct. It continues to conduct for the period $t_{3a}$ to $t_{3b}$. By the time $t_{3b}$, the SCR has turned off and it no longer conducts current through its anode-to-cathode path. The spark duration is from the period $t_2$ to $t_{3b}$. Times $t_{3a}$ to $t_{3b}$ will occur within the interval $t_3$ to $t_5$ of FIGURES 2 and 3. These times will depend upon the ringing period (single cycle) of the resonant circuit which includes the capacitor 26 and the inductance associated with transformer 34 and coil 36, and are matters of engineering design. The SCR, however, is usually off by the time $t_5$ when the points 80 close.

The period $t_{3a}$-$t_{3b}$ is legended "SCR turn-off time" in FIG. 3. The actual forward current goes off when the cycling current reverses (time 3a). No current now flows through the SCR, but it can't necessarily be considered "off" until the depletion regions have built up and established the SCR's ability to handle reapplied forward voltage, which happens no later than the time $t_{3b}$ when the negative current flow stops.

The waveforms illustrated in FIG. 3 are minimum pulse widths which occur when the secondary winding 33 has a "low voltage" termination and when a minimum secondary leaking inductance coil is used. The capacitor voltage does not return to its original value at the end of the pulse (time $t_{3b}$) because of the power (and thus energy) which has been lost, that is, the power manifested as secondary current $I_{33}$ flowing through an ionization voltage drop. However, much of the stored energy is recovered in this system and this allows use of a relatively large capacitor 26 which in turn results in high spark plug current and long arc duration.

During the period $t_4$ to $t_5$, the three capacitors 44, 78 and 64 are essentially fully charged and the circuit remains at rest until the points close.

The points close at time $t_5$, almost immediately bounce open again, reclose at time $t_7$, and bounce open again finally closing at $t_8$. When the points initially close (time $t_5$) capacitor 44 discharges almost immediately through the points and voltage A goes to ground or close to it. Capacitors 64 and 78 discharge through the circuit which includes the base-collector junction of transistor 48. This discharge circuit includes the path through resistor 58 to ground and also from ground through the cathode-to-gate circuit of SCR 30 and resistor 68. There is also a shunt path, resistor 85, for the discharge of capacitor 64, thus shunt path also including the cathode-to-gate circuit of SCR 30 and resistor 68.

The direction of discharge (time $t_5$) is such as to drive the gate electrode 70 negative as shown at D in FIG. 2. This negative voltage on the gate 70 of SCR 30 prevents noise from re-triggering the SCR. The impedance of the discharge path is sufficiently low (for example, 68 may be in the range 0-2.2 K ohms and 58 may be 27 ohms), that the voltage D changes from $V_{CE(SAT)}$ to a negative valve substantially instantaneously.

The discharge of capacitor 78 continues until the voltage B reduces from its relatively higher positive level to the reference positive level V/4. Capacitor 64, however, continues to discharge through resistor 85 toward ground. As long as capacitor 64 is discharging, the gate electrode 70 is held negative, keeping SCR 30 off. Note in FIG. 2 the negative voltage level from $t_5$ to $t_6$ at D.

The waveforms show how the circuit is able to discriminate against the point bounce which occurs between times $t_5$ and $t_8$. Before capacitor 64 can deliver another firing pulse, the voltage C must fall below the voltage B so that it will be possible for the voltage C rapidly to rise again to cause the gate electrode 70 to go sufficiently positive to exceed the threshold level of the SCR. For a time, voltages C and B fall together. At time $t_6$, voltage A reaches a value sufficiently high to turn on transistor 48. But the change in level of C is insufficient to turn on the SCR because C initially was higher than B. Note the relatively small pulse at D (time $t_6$-$t_7$). At time $t_8$, the voltage A has not yet reached the reference Considering pulse race path 64, the course is run as follows: Trigger circuit 60 provides a signal to $I_{set}$ switch 68 of the linear oscillator circuit 65 to close it upon the reception of the trigger voltage. $I_{set}$ is a constant current of a known value, more fully described in copending application Ser. No. 576,897 filed May 12, 1975, entitled "Linear Oscillator for Proximity Sensor". Upon closing the $I_{set}$ switch 68, $I_{set}$ is provided to proximity detector 12 and probe 13. Oscillations begin to build on the output of proximity detector 12 in a manner more fully described in the copending application. The oscillating signal is produced by probe 13 which is a tank circuit having a particular Q. The Q of the probe 13 varies linearly with the distance a ferrous object is located from it. Also, the amplitude of the oscillations provided to the level detector 70 is dependent upon the location of can 16 with respect to probe 13. The closer the ferrous object is to the probe, the lower the amplitude of the oscillators provided to the level detector 70. Typically, the bandpass of the probe is 3–4K Hz and the amplitude of oscillations reaches 95% of the level which it will ultimately attain in approximately 0.5 milliseconds.

Level detector 70 provides an output pulse if the amplitude of the oscillations exceeds a preset threshold level. If the amplitude does not reach the level, no pulse is provided on the output of synchronous level detector 70. Hence, a pulse will be provided on the output when there is no ferrous article within the sensing range of probe 13. Pulses will be provided on the output of level detector 70 once every half cycle of the AC source until can 16 moves sufficiently close to probe 13 to inhibit the amplitude of the oscillations from the proximity detector 12 from reaching the preset threshold level of the level detector 70. The output of synchronous level detector 70 is provided to "OFF" terminal 44.

Considering the other path 66 from race start circuit 60, the course is run as follows: Race start circuit 60 provides a pulse to time delay circuit 72 upon the reception of the trigger voltage. Time delay circuit 72 provides an output pulse at a point in time delayed form the reception of the pulse at its input. The delay period is selected in order to give the signal on path 64 a chance to build up to and surpass the preset threshold level of the level detector 70 in the short amount of time given. For example, if the oscillations from proximity detector circuit 12 build up to and pass the threshold voltage as established by the level detector 70 in 0.5 milliseconds, that is an indication that no ferrous object is near probe 13 and a pulse appears at "OFF" terminal 44 in 0.5 milliseconds. If the time delay of circuit 72 is set for 0.6 milliseconds, this will give the pulse on path 64 a chance to appear. However, if a ferrous object appears within the sensing range of probe 13, pulses from the level detector 70 are discontinued and the pulse from the time delay circuit 72 wins the pulse race. Therefore, in the event that no metal is present near probe 13, the pulse on race path 64 will always win the race because the oscillating voltage from the proximity sensor builds to a level greater than the threshold of level detector 70 in a period of time less than that established by the delay circuit.

Hysteresis circuit 68 controls the operation of the entire circuit when can 16 is located in the transition zone between being detected and not being detected. To accomplish this control in the case where the load 10 is to be energized at the sensing of the presence of can 16, an increase of time delay in time delay circuit 72 is effected which gives the pulse race path 64 added time to win the race. In other words, when the can is once detected by probe 13 to effect the closing of the triac control switch 20, that closed condition is favored by the insertion of an extra time delay in the circuit 72. Therefore, when the can is in the transition zone, the hysteresis circuit precludes the triac control switch 20 from alternately opening and closing in a random manner.

Referring to FIG. 5, the trigger circuit 60 is responsible for providing the pulse at the start of the pulse race at the beginning of each half period of the rectified sine wave from source 22. Accordingly, the trigger circuit 60 is connected to the potential $V_R$ (see FIG. 3). As the sine wave begins to build during the half period, the building voltage appears at resistors 80 and 82. When the rectified sine wave voltage reaches approximately 6 volts, that value is maintained across resistors 80 and 82 because of the 6 volt zener diode 84. The regulated voltage $V_R$ of approximately 6 volts, therefore, is present to the emitter of transistor 86 after the rectified sine wave has exceeded the 6 volt value of the zener diode 84.

As the rectified sine wave continues to build and surpasses the 12 volt level established by zener diode 88, that voltage appears across resistor 91 at the base of transistor 90 forward-biasing the base-emitter junction to turn it on. When transistor 90 is on, a voltage divider network is established between resistors 80 and 92 which forwardbiases the base-emitter junction of transistor 90 to provide the output pulses to time delay circuit 72 and the linear oscillator 65. Specifically, when transistor 90 turns on, transistor 86 is rendered conductive and the 6 volts at the emitter of transistor 86 appear as a pulse on the output of the circuit. The pulse turns off when the rectified sine wave decreases to a value less than approximately 12 volts. The pulse is provided for every half period of the source voltage.

Figure 4:
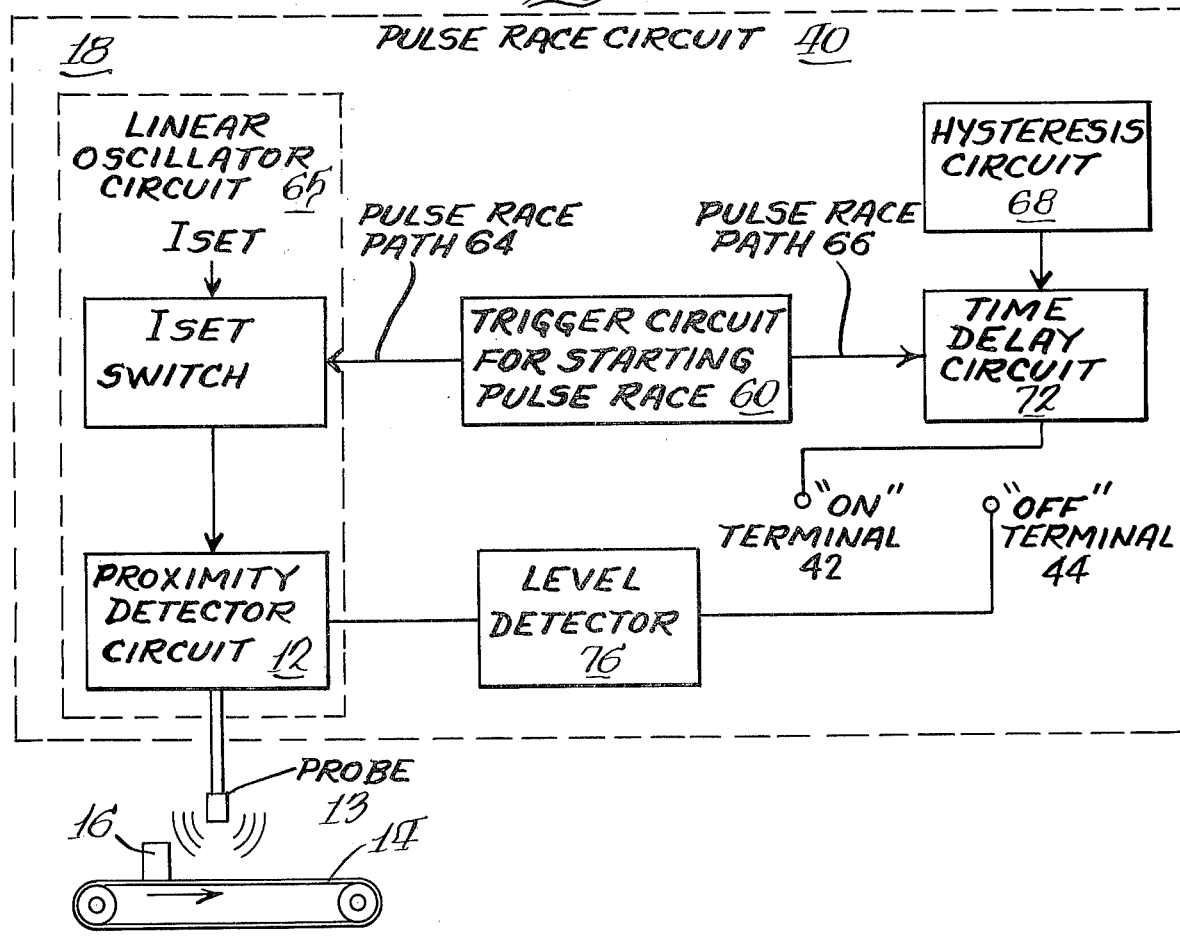
FIG. 4 is a block diagram of the pulse race circuit which controls the solid state limit switch.

Referring to FIG. 6, level detector 76 includes a voltage divider having two resistors 94 and 96 to establish a voltage drop $V_A$ across resistor 96. The connection between resistors 94 and 96 is provided to the negative input of operational amplifier 98. The voltage $V_A$ is considered the threshold voltage and an output pulse is provided to "OFF" terminal 44 when and if the voltage from the proximity detector 12 of the linear oscillator circuit 65 exceeds the value of $V_A$. In other words, as the voltage from the proximity detector 12 begins to build, an output pulse is provided when the voltage on the positive input to the operational amplifier exceeds the value of $V_A$. It should be noted that $V_A$ can be adjusted to any value and is selected in accordance with the particular voltage levels established in the time delay circuit 72 (FIG. 4). The voltage on the output of the operational amplifier 98 discontinues when the voltage $V_A$ exceeds the voltage on the positive input terminal from the proximity detector circuit 12.

Referring to FIG. 7, time delay circuit 72 is shown to have two inputs and one output. One input receives the pulse from the trigger circuit 60 as shown in FIG. 4. The other input is from the hysteresis circuit 68. The purpose of the hysteresis circuit, as explained above, is to increase the delay time of the delay circuit 72 to give the other pulse on pulse path 64 a chance to win the race under the appropriate conditions. Specifically, when a positive voltage of approximately 6 volts is received from the hysteresis circuit 68, transistor 100 is rendered conductive since its base-emitter junction is forwardbiased and the voltage of approximately $V_R$ therefore appears at the emitter of transistor 102 across resistor 104. With a voltage of $V_R$ appearing at the emitter of transistor 102, the voltage at the base of transistor 102 must exceed this higher emitter voltage to turn on. This condition takes more time than in the case where $V_R$ does not appear on the emitter of transistor 102. When the source voltage exceeds 12 volts, as stated earlier, a pulse is received from the trigger circuit 40 by resistor 106 and capacitor 108. The voltage builds at the base of transistor 102 as a function of the time constant of resistor 106 and capacitor 108. When the voltage at the emitter of transistor 102 is overcome, transistor 102 turns on and a voltage appears at the collector of Q2 which forward-biases transistor 110 through resistor 112 to provide an output pulse on the output line to the "ON" terminal 42. When no positive voltage is received from the hysteresis circuit, the delay circuit 68 takes a less amount of time to overcome the emitter voltage from transistor 102 and therefore the pulse is provided to "ON" terminal 42 at a point in time earlier than that at which it would have occurred in the event that the voltage from the hysteresis circuit was received.

The hysteresis circuit is responsible for controlling the circuit operation when an article such as can 16 (FIG. 1) is in the transition zone between being sensed being sensed and not being sensed, as stated above. Specifically, since the decision regarding the presence or absence of can or article 16 is made twice every cycle of the source frequency, assurances must be made that an article located exactly in the transition zone does not indicate a closed condition for one-half period of the source frequency and then an open condition for the next half. In other words, the hysteresis circuit assures the same results for the same proximity condition and does so by providing an advantage to the winner of the last pulse race. Specifically, the circuit provides a voltage which gives the winner of the last pulse race an advantage in the subsequent race. This technique assures that an article such as can 16, which first makes its appearance near probe 13 and changes the condition of the transformerless triac control switch 20, makes the same decision during the next opportunity to control the transformerless triac control switch. The advantage developed by the winner of the prior pulse race, therefore, affects the outcome of the subsequent pulse race so that the transformerless triac control circuit does not intermittently or alternately turn on and off when the article such as can 16 is within the transition zone.

Referring to FIG. 8, the hysteresis circuit is provided with a voltage $+V_R$. The voltage that appears on the input of the hysteresis circuit depends upon the on/off condition of the triac 24. When the triac 24 is nonconducting, a rectified sine wave $V_R$ appears on the inputs of the hysteresis circuit 68 and a voltage is developed across resistors 114 and 116 and capacitor 118 which permits the voltage across capacitor 118 to build. Under this condition, the voltage is limited to 6 volts by zener diode 120. Diode 120 precludes an excessive and unnecessary voltage buildup across capacitor 118. When a voltage developed by capacitor 118 appears at the connection of resistors 114 and 116, this is an indication that the triac 24 is off. In that case, a voltage is provided to the output of the hysteresis circuit to the delay circuit 72. A voltage applied to the delay circuit lengthens the time of the time delay circuit, as discussed previously. In the event that no voltage appears across capacitor 118 during the half period, this is an indication that the triac 24 was on for the last half period of the source voltage. Accordingly, 0 voltage is provided to the delay circuit 72, and in that case, there is no extra time delay established. Any voltage established by the capacitor 118 and provided to the time delay circuit 72 by the hysteresis circuit 68 decays to a low level during the half period before the subsequent half period of the rectified sine wave as developed by the source applied to it.

In the above explanation, it should be clear that the metal present condition of the circuit turns transistor 38 (FIGS. 2 and 3) on to effect an energization of load 10. If it is desired that the metal present condition deenergize the load, the line from the time delay circuit 72 is connected to "OFF" terminal 44 and the line from synchronous level detector 70 is connected to "ON" terminal 42. Also, it should be apparent that, in an effort to overcome the problem in the area of transitional zones in this case, the output from the hysteresis circuit must be disconnected from the time delay circuit 72 and connected in such a manner which would favor the pulse race path 64. For example, one alternative to providing an advantage to pulse race path 64 would be to provide a higher $I_{set}$ current through the $I_{set}$ switch to the proximity detector circuit 12 to enhance the oscillation of probe 13 so that buildup toward the threshold level at level detector 76 can be accomplished in a more speedy fashion.

We claim:
1. A circuit for controllably providing power from an AC source to a load upon the sensing of a conductive body comprising:
   means for starting a pulse race between a first and a second pulse at the beginning of each half period of the AC source;
   a first pulse path means coupled to said pulse race starting means for passing said first pulse in the event that a conductive body is not sensed within an established period of time and inhibiting said first pulse in the event that a conductive body is sensed within the established period of time;
   a second pulse path means coupled to said pulse race starting means for passing the second pulse after a delay time, which delay time is longer than said established period of time;
   terminal means coupled to said first and second pulse path means for receiving the first and second pulse;
   means for connecting the AC source to a load upon reception of the second pulse prior in time to the reception of the first pulse, said connecting means coupled to said terminal means; and
   means for disconnecting the AC source from the load upon reception of the first pulse prior in time to the reception of the second pulse, said disconnecting means coupled to said terminal means.
2. The circuit as claimed in claim 1 further including: hysteresis means coupled to said second pulse path means for providing an increase in the delay time upon a previous sensing of the conductive body.
3. A circuit for controllably providing power from an AC source to a load upon a nonsensing of a conductive body comprising:
   means for starting a pulse race between a first and a second pulse at the beginning of each half period of the AC source;
   a first pulse path means coupled to said pulse race starting means for passing said first pulse in the event that a conductive body is not sensed within an established period of time, and inhibiting said first pulse in the event that a conductive body is sensed within the established period of time;

a second pulse path means coupled to said pulse race starting means for passing the second pulse after a delay time, which delay time is longer than said established period of time;

terminal means coupled to said first and second pulse path means for receiving the first and second pulse;

means for connecting the AC source to the load upon the reception of the first pulse prior in time to the reception of the second pulse, said connecting means coupled to said terminal means; and means for disconnecting the AC source from a load upon the reception of the second pulse prior in time to the reception of the first pulse, said disconnecting means coupled to said terminal means.

4. The circuit as claimed in claim 3 further including hysteresis means coupled to said first pulse path means for providing an increase in the established period of time upon a previous sensing of the conductive body.

5. A circuit for controllably providing power from an AC source to a load comprising:

a triac having a first and a second terminal and a gate wherein the first terminal is coupled to a load and the second terminal is coupled to an AC source through a circuit ground such that when the triac is conducting, AC power is applied to the load and when the triac is not conducting, no AC power is applied thereto;

triac turn-on/off means connected to a resistor, said turn-on/off means coupled to said first terminal of the triac, and resistor coupled to said second terminal of the triac and the gate of the triac connected between the resistor and the turn-on/off means for turning the triac on and off;

means for starting a pulse race between a first and a second pulse at the beginning of each half period of the AC source;

a first pulse path means coupled to said pulse race starting means for passing said first pulse in the event that a conductive body is not sensed within an established period of time and inhibiting said first pulse in the event that a conductive body is sensed within the established period of time;

a second pulse path means coupled to said pulse race starting means for passing the second pulse after a delay time, which delay time is longer than said established period of time;

terminal means coupled to said first and second pulse means for receiving the first and the second pulse;

a first control means coupled to said turn-on/off means and to said terminal means for grounding said turn-on/off means upon reception of the second pulse prior in time to the reception of the first pulse; and a second control means coupled to said turn-on/off means and to said terminal means for precluding grounding of said turn-on/off means upon reception of the first pulse prior in time to the reception of the second pulse.

6. A circuit for controllably providing powder from an AC source to a load comprising:

a triac having a first and a second terminal and a gate wherein the first terminal is coupled to a load and the second terminal is coupled to an AC source such that when the triac is conducting, AC power is applied to the load and when the triac is not conducting, no AC power is applied thereto;

triac turn-on/off means connected to a resistor, said turn-on/off means coupled to said first terminal of the triac, said resistor coupled to said second terminal of the triac and the gate of the triac connected between the resistor and the turn-on/off means for turning the triac on and off; and control means including a first SCR having a cathode, an anode and a gate wherein the anode of the first SCR is coupled to said turn-on/off means and the cathode of the first SCR is connected to a second resistor which is connected to a third resistor, said third resistor also coupled to ground such that a pulse applied to the gate of the first SCR renders the first SCR conductive to provide a potential between said second and third resistors, which potential effects turn-on of said turn-on/off means.

7. The circuit as claimed in claim 6 wherein the control means further includes:

a second SCR having a cathode, an anode and a gate wherein the anode of the second SCR is coupled to the turn-on/off means and the cathode of the second SCR is connected to a fourth resistor, said fourth resistor also coupled to ground such that a pulse applied to the gate of the second SCR renders the second SCR conductive to provide a potential to the fourth resistor, which potential precludes turn-on of said turn-on/off means.

8. The circuit as claimed in claim 7 wherein the control means further includes:

means for preventing the first SCR from conducting in response to the pulse applied to the gate of the first SCR if the pulse to the gate of the second SCR is received at a point in time prior to receiving the pulse applied to the gate of the first SCR, and means for preventing the second SCR from conducting in response to the pulse applied to the gate of the second SCR if the pulse to the gate of the first SCR is received at a point in time prior to receiving the pulse applied to the gate of the second SCR.

* * * * *